(12) United States Patent
Matsuuchi et al.

(10) Patent No.: US 8,128,783 B2
(45) Date of Patent: Mar. 6, 2012

(54) PLASMA GENERATOR AND WORK PROCESSING APPARATUS PROVIDED WITH THE SAME

(75) Inventors: Hidetaka Matsuuchi, Wakayama (JP);
Ryuichi Iwasaki, Wakayama (JP);
Hirofumi Mankawa, Wakayama (JP);
Shigeru Masuda, Wakayama (JP);
Masaaki Mike, Wakayama (JP); Sang Hun Lee, San Ramon, CA (US)

(73) Assignees: Amarante Technologies, Inc., Santa Clara, CA (US); Saian Corporation, Wakayama (JP)

( * ) Notice: Subject to any disclaimer, the term of this patent is extended or adjusted under 35 U.S.C. 154(b) by 389 days.

(21) Appl. No.: 12/310,896

(22) PCT Filed: Sep. 12, 2007

(86) PCT No.: PCT/JP2007/068212
§ 371 (c)(1),
(2), (4) Date: Mar. 11, 2009

(87) PCT Pub. No.: WO2008/032856
PCT Pub. Date: Mar. 20, 2008

(65) Prior Publication Data
US 2009/0200910 A1    Aug. 13, 2009

(30) Foreign Application Priority Data
Sep. 13, 2006  (JP) .................................. 2006-247863

(51) Int. Cl.
*C23C 16/00*   (2006.01)
*C23F 1/00*    (2006.01)
*H01L 21/306*  (2006.01)
*B23K 9/00*    (2006.01)
*B23K 9/02*    (2006.01)
*H01J 17/26*   (2006.01)
*H01J 7/24*    (2006.01)
*H05B 31/26*   (2006.01)

(52) U.S. Cl. ....... 156/345.41; 118/723 MW; 219/121.5; 315/111.21; 313/231.31

(58) Field of Classification Search ............. 156/345.41; 118/723 MW; 315/111.21; 219/121.5; 313/231.31
See application file for complete search history.

(56) References Cited

U.S. PATENT DOCUMENTS

| | | | |
|---|---|---|---|
| 4,185,213 A | 1/1980 | Scannell | |
| 5,647,944 A | 7/1997 | Tsubaki et al. | |

(Continued)

FOREIGN PATENT DOCUMENTS

| | | |
|---|---|---|
| JP | 2-158100 | 6/1990 |
| JP | 5-146879 | 6/1993 |
| JP | 7-114998 | 5/1995 |
| JP | 2000-012283 | 1/2000 |

(Continued)

OTHER PUBLICATIONS

English Translation of JP 2002203844, Ishii et al dated Jul. 19, 2002.*

*Primary Examiner* — Rakesh Dhingra
(74) *Attorney, Agent, or Firm* — Jordan and Hamburg LLP

(57) ABSTRACT

A plasma generator is provided which includes: a microwave generation portion which generates a microwave; a wave guide for propagating the microwave; a plurality of plasma generation nozzles which are attached to the wave guide so as to be apart from each other in the direction where the microwave is propagated, receive the microwave, and generate and emit a plasmatic gas based on the energy of this microwave; and a plurality of stabs which correspond to a part or the whole part of the plasma generation nozzles and are each disposed in the wave guide so as to lie in a rear position a predetermined distance apart from each other in the direction where the microwave is propagated.

16 Claims, 12 Drawing Sheets

U.S. PATENT DOCUMENTS

| | | | |
|---|---|---|---|
| 5,796,080 A * | 8/1998 | Jennings et al. | 219/697 |
| 6,016,766 A * | 1/2000 | Pirkle et al. | 118/723 MW |
| 6,383,953 B2 * | 5/2002 | Hwang | 438/788 |
| 6,463,874 B1 | 10/2002 | Dotter, II et al. | |
| 2002/0180555 A1 * | 12/2002 | Harris | 333/125 |
| 2004/0011465 A1 * | 1/2004 | Matsumoto et al. | 156/345.41 |
| 2004/0016402 A1 | 1/2004 | Walther et al. | |
| 2006/0006153 A1 | 1/2006 | Lee et al. | |
| 2006/0021581 A1 | 2/2006 | Lee et al. | |
| 2006/0042546 A1 | 3/2006 | Ishii et al. | |
| 2008/0073202 A1 * | 3/2008 | Lee et al. | 204/164 |

FOREIGN PATENT DOCUMENTS

| | | |
|---|---|---|
| JP | 2001-320227 | 11/2001 |
| JP | 2002-168892 | 6/2002 |
| JP | 2002-203844 | 7/2002 |
| JP | 2003-197397 | 7/2003 |
| JP | 2005-095744 | 4/2005 |
| JP | 2005-534187 | 11/2005 |
| JP | 2008-508683 | 3/2008 |
| WO | WO-2004/010746 | 1/2004 |
| WO | WO-2006/14862 | 2/2006 |
| WO | WO-2007/086875 | 8/2007 |

* cited by examiner

PLASMA GENERATOR AND WORK PROCESSING APPARATUS PROVIDED WITH THE SAME

TECHNICAL FIELD

The present invention relates to a plasma generation device which irradiates a work to be processed such as a substrate or the like with plasma to thereby clean a surface of the work, reform the surface quality of the work, or realize another processing, and a work processing apparatus provided with this.

BACKGROUND ART

A work processing apparatus exposes plasma to a work to be processed such as semiconductor wafer for organic removal, surface modification, etching, thin film deposition, and/or thin film removal. For an example, a plasma processing apparatus is disclosed in Japanese Patent Laid-Open Publication No. 2003-197397. A plasma generation nozzle is used which includes an interior electric conductor and an exterior electric conductor which are concentric with each other. Between the interior and exterior electric conductors, a high-frequency pulse electric field is applied, and thereby, not an arc discharge but a glow discharge is produced so that plasma can be generated. In this apparatus, a processing gas from a gas supply source makes its way from a base end of the nozzle to a free end of the nozzle while whirling around between both electric conductors. Thereby, denser plasma is generated to emit from the free end to a work to be processed. This helps secure plasma with a high density under an atmospheric pressure.

However, in the above described prior art, although the use of such a single plasma generation nozzle is shown, no mention is made of a plurality of such plasma generation nozzles. Hence, in processing a work having a large area or a plurality of works to be processed simultaneously, how to uniformly apply plasma to works having various shapes using the plurality of plasma generation nozzles cannot be imagined and reached.

DISCLOSURE OF THE INVENTION

It is an objective of the present invention to provide a plasma generation device which is capable of uniformly irradiating a plurality of works to be processed or a large-area work to be processed with plasma, and a work processing apparatus provided with this.

In order to attain this objective, a plasma generation device according to an aspect of the present invention, comprising: a waveguide for propagating a microwave therethrough; a plurality of plasma generation nozzles secured to the waveguide and operative to receive processing gas and excite the processing gas into plasma using the microwave; and a plurality of stubs secured to the waveguide, one or more of the stubs being disposed around a corresponding one of the nozzles and operative to control an amount of microwave taken by the corresponding nozzle.

In addition, according to another aspect of the present invention, a work processing apparatus includes: the plasma generation device having the above described configuration; and a mechanism for moving a work relative to the plasma generation nozzles so that the work is irradiated with plasma generated by the plasma generation nozzles.

BRIEF DESCRIPTION OF THE DRAWINGS

FIG. 3 is a side view of the work processing apparatus, partly seen through.

BEST MODE FOR CARRYING OUT THE INVENTION

Figure 1:
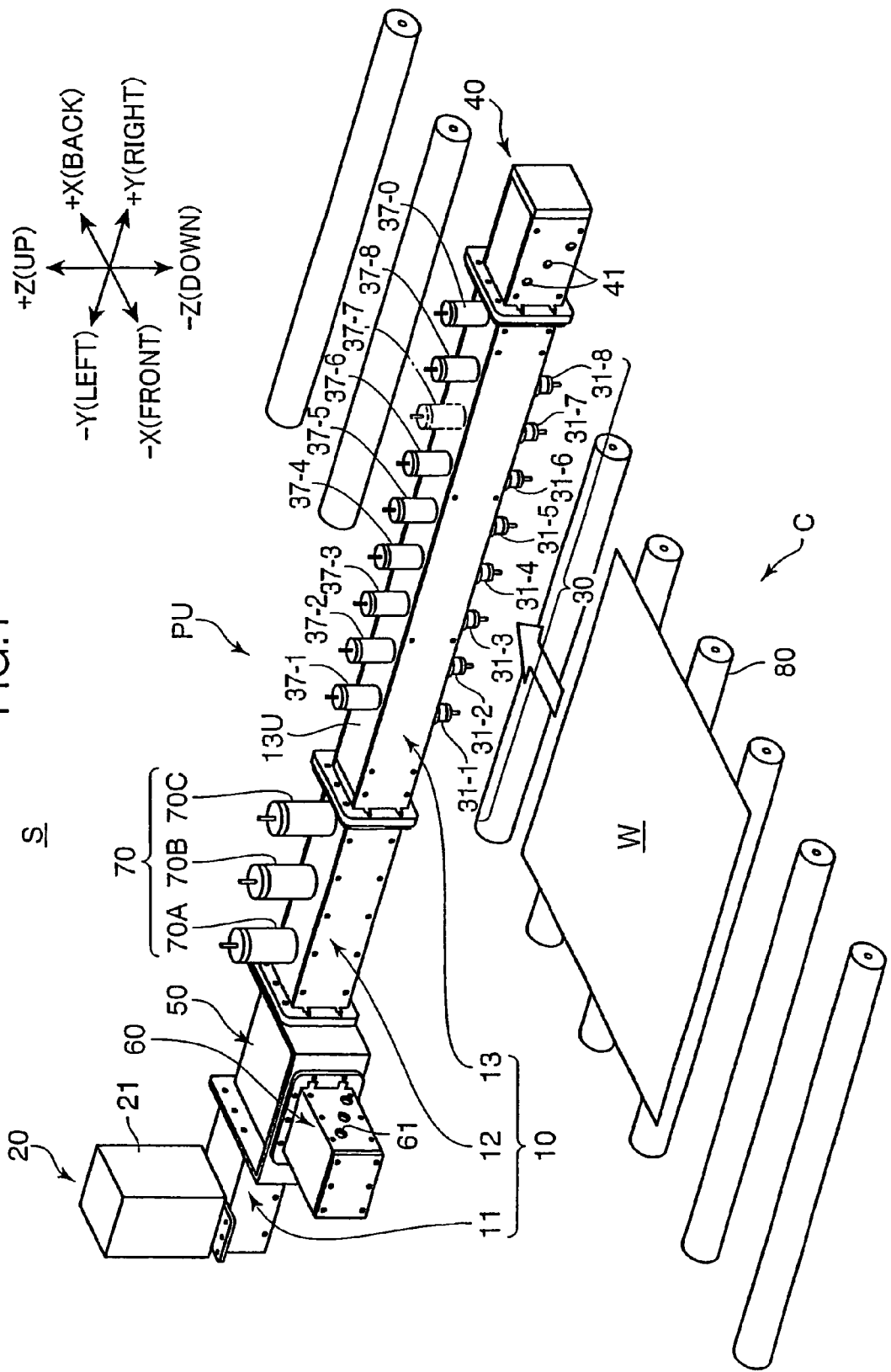
FIG. 1 is a perspective view of a work processing apparatus according to an embodiment of the present invention, showing its whole configuration.

FIG. 1 is a perspective view of a work processing apparatus S according to an embodiment of the present invention, showing its whole configuration. This work processing apparatus S includes: a plasma generation unit PU (i.e., the plasma generator) which generates plasma to thereby irradiate a work W to be processed with this plasma; and a carrying mechanism C which carries the work W on a predetermined route by way of the region where the plasma is applied.

Figure 2:
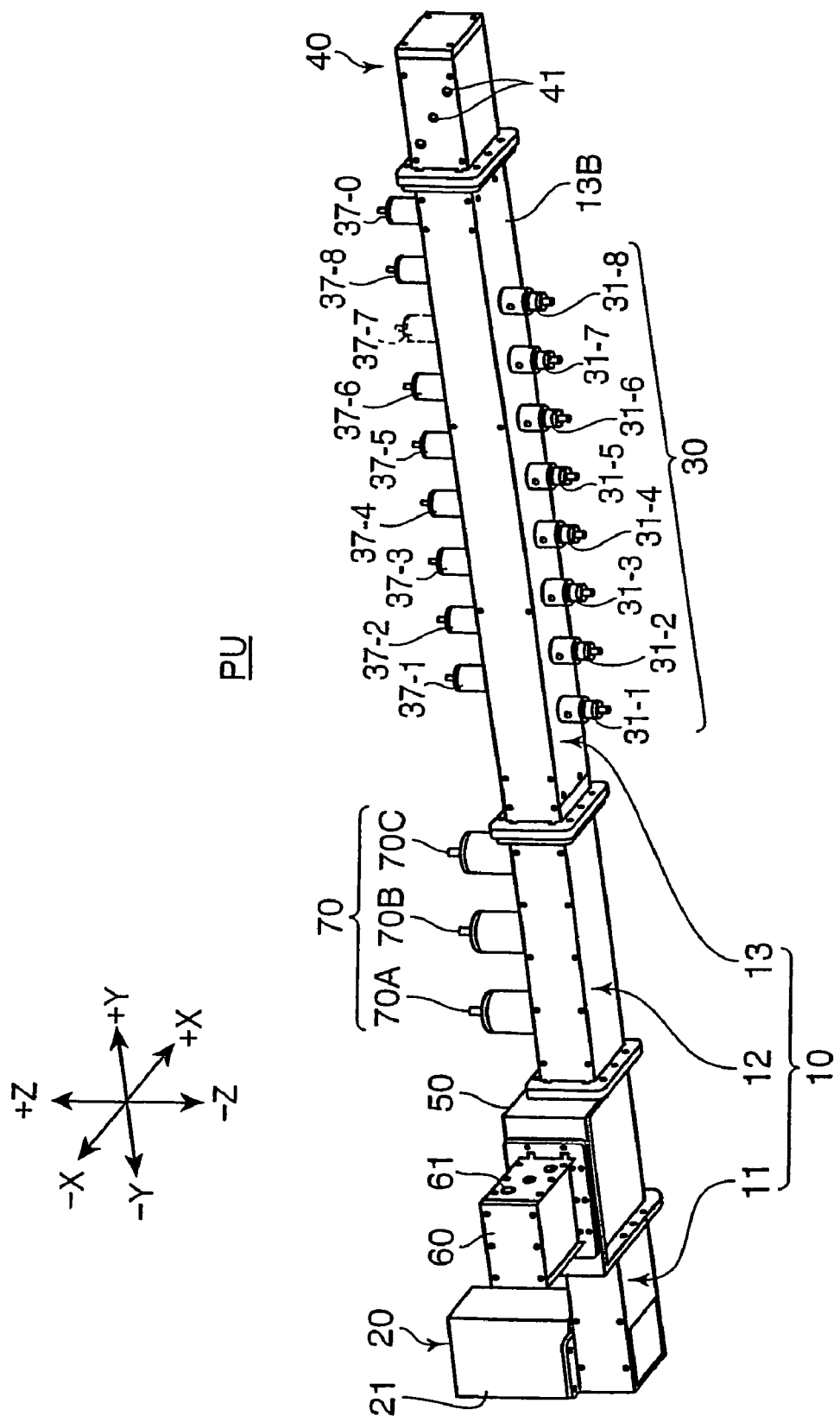
FIG. 2 is a perspective view of a plasma generation unit, seen from a different angle from FIG. 1.
Figure 3:
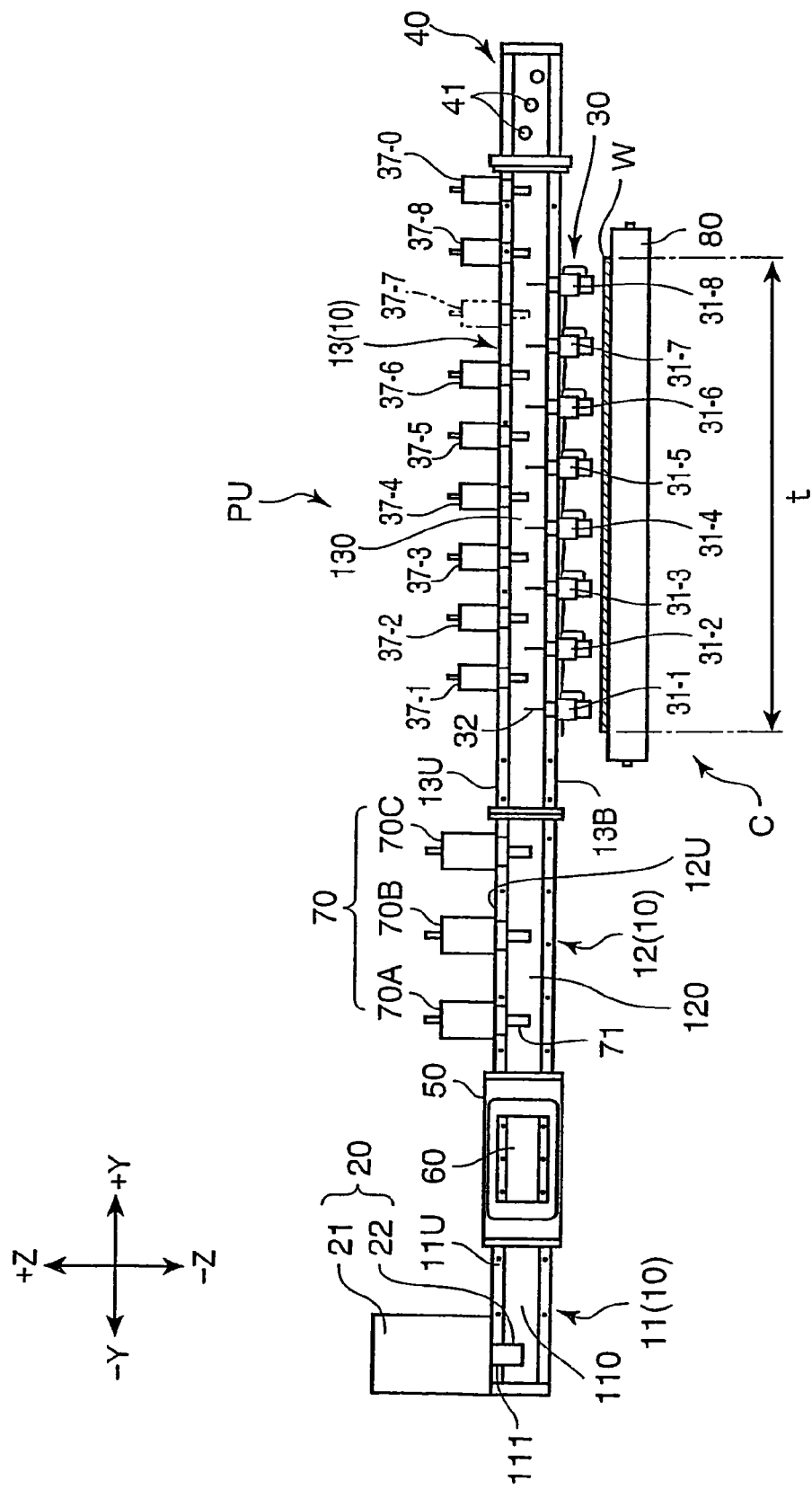

FIG. 2 is a perspective view of the plasma generation unit PU, seen from a different angle from FIG. 1. FIG. 3 is a side view of the plasma generation unit PU, partly seen through. In FIG. 1 to FIG. 3, the X-X directions represent the front-and-back directions; the Y-Y directions, the right-and-left directions; and the Z-Z directions, the up-and-down directions. Then, the −X direction indicates the front; the +X direction, the back; the −Y direction, the left; the +Y direction, the right; the −Z direction, downward; and the +Z direction, upward.

The plasma generation unit PU is a unit which can generate plasma at an ambient temperature and an atmospheric pressure, using a microwave. The plasma generation unit PU includes: a waveguide 10 for propagating a microwave; a microwave generation unit 20 which is provided at one end (on the left) of this waveguide 10 and generates a microwave having a known wavelength; a plasma generation portion 30 provided in the waveguide 10; a dummy load 40 which is provided at the other end (on the right) of the waveguide 10 and absorbs a microwave; a circulator 50 which separates a reflected microwave of the microwave emitted to the waveguide 10 so that the reflected microwave will not return to the microwave generation unit 20; a dummy load 60 which absorbs the reflected microwave separated by the circulator 50; and a stub tuner 70 which makes an impedance match between the waveguide 10 and a plasma generation nozzle 31.

The carrying mechanism C includes carriage rollers 80 which are rotated by a driving means (not shown). In this embodiment, an example is shown in which the flat work W is carried by the carrying mechanism C.

The waveguide 10 is made of a non-magnetic metal, such as aluminum and has a generally elongated rectangular cylinder shape. It is used for propagating, in its longitudinal direction, a microwave generated by the microwave generation unit 20 toward the plasma generation portion 30. The waveguide 10 is formed by the connection body of a plurality of separate waveguide pieces to each other at their flange parts. In the mentioned order from one end of it are connected a first waveguide piece 11 on which the microwave generation unit 20 is mounted, a second waveguide piece 12 to which the stub tuner 70 is attached, and a third waveguide piece 13 in which the plasma generation portion 30 is disposed. Between the first waveguide piece 11 and the second waveguide piece 12, the circulator 50 is disposed, and the dummy load 40 is connected to the other end of the third waveguide piece 13.

Each of the first waveguide piece 11, the second waveguide piece 12 and the third waveguide piece 13 is assembled, using an upper plate, a lower plate 13B and two side plates which are each formed by a metal flat plate, so that they each have a square-pipe shape. Then, they are each formed by attaching a flange plate to both ends. In one exemplary embodiment, instead of the assembly of such flat plates, a rectangular waveguide piece or a non-separate waveguide may also be used which is formed by extrusion molding, folding a plate-shaped member or the like. Besides, it is not limited to a waveguide with a rectangular section, and thus, for example, a waveguide whose section is elliptic can also be used. In addition, it is not limited to a non-magnetic metal, and thus, such a waveguide can also be formed by each type of member which has a wave-guiding function.

The microwave generation unit 20 includes: a unit body portion 21 which includes a microwave generation source such as a magnetron which generates a microwave, for example, with a frequency of 2.45 GHz; and a microwave transmission antenna 22 which radiates a microwave generated in the unit body portion 21 to the inside of the waveguide 10. In the plasma generation unit PU according to this embodiment, for example, the power adjustable microwave generation unit 20 is preferably used which can output microwave energy of 1 W to 3 kW.

As shown in FIG. 3, the microwave generation unit 20 is shaped so that the microwave transmission antenna 22 protrudes from the unit body portion 21. It is placed and fixed on the first waveguide piece 11. In detail, the unit body portion 21 is placed on an upper plate 11U of the first waveguide piece 11. Then, the microwave transmission antenna 22 passes through a penetrating hole 111 formed in the upper plate 11U and is fixed so as to protrude into a wave-guidance space 110 inside of the first waveguide piece 11. According to such a configuration as described above, a microwave, for instance, with a frequency of 2.45 GHz which is radiated from the microwave transmission antenna 22 is propagated through the waveguide 10 from its one end (the left) to the other end (the right).

The plasma generation portion 30 is provided, on a lower plate 13B (i.e., the surface facing the work W to be processed) of the third waveguide piece 13, with eight plasma generation nozzles 31-1 to 31-8 (hereinafter, given a reference numeral 31 generically) which are set in array so as to protrude in a line in the right-and-left directions. Besides, the plasma generation portion 30 is provided with: on an upper plate 13U of the third waveguide piece 13, stub tuner units 37-1 to 37-8 (hereinafter, given a reference numeral 37 generically) which correspond to each plasma generation nozzle 31-1 to 31-8 and are each disposed rearward in the direction where the microwave is propagated; and a stub tuner unit 37-0 near the outlet of the third waveguide piece 13. Hereinafter, the terms rear (or, rearward) and downstream are used interchangeably.

The width of the plasma generation portion 30, in other words, how widely the eight plasma generation nozzles 31 are disposed in the right-and-left directions, is substantially equal to a size t of the flat work W in the width direction perpendicular to the direction in which it is carried. Thereby, the work W is subjected, over its entire surface (i.e., the surface opposite to the lower plate 13B), to a plasma processing while being carried by the carriage rollers 80.

Figure 4:
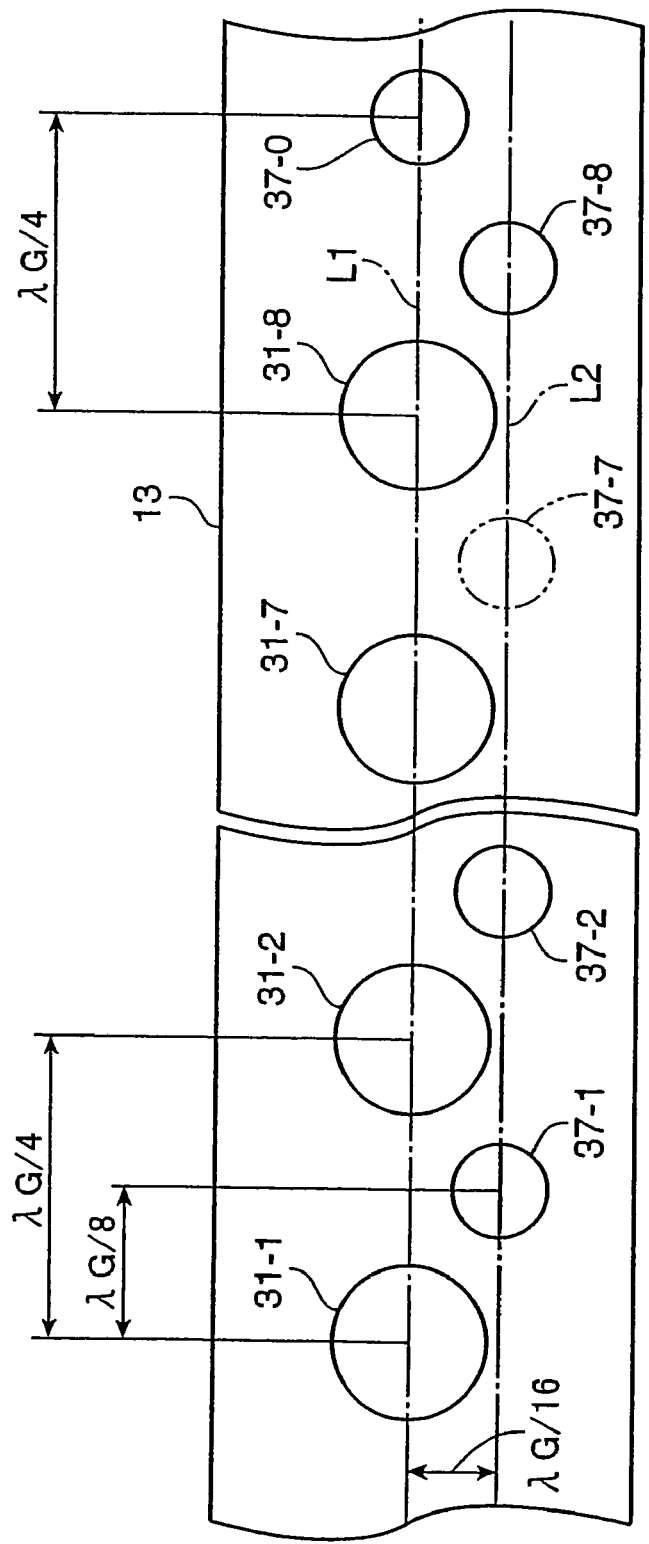
FIG. 4 is a plan view of a wave guide, plasma generation nozzles and stub tuner units, illustrating their arrangement in the wave guide.

As shown in FIG. 4, the eight plasma generation nozzles 31 are set in array on a first straight line L1 which is an axis of the waveguide 10 and runs along the direction where the microwave is propagated. The interval at which they are arranged is determined in accordance with a wavelength $\lambda G$ of a microwave propagated inside of the waveguide 10. Preferably, for example, they can be arranged at a pitch of half or quarter of the wavelength $\lambda G$. If a microwave having a frequency of 2.45 GHz is used, then $\lambda G=230$ mm. Thereby, they are arranged at 115-mm ($\lambda G/2$) pitches or 57.5-mm ($\lambda G/4$) pitches.

Each stub tuner unit 37 is set in array on a second straight line L2 parallel to the first straight line L1 which is offset from the first straight line L1. Each stub tuner unit 37 corresponds to each plasma generation nozzle 31 and is disposed in a rear position (or downstream) in the direction where the microwave is propagated. In the same way as the plasma generation nozzles 31, they should be arranged at a pitch of half or quarter of the wavelength $\lambda G$ on the second straight line L2. As a result, each stub tuner unit 37 is arranged so as to shift rearward by half the array pitch of each plasma generation nozzle 31, in other words, shift rearward by a pitch of quarter or one-eighth of the above described wavelength $\lambda G$.

The offset distance between the first straight line L1 and the second straight line L2 can be set to, for example, a quarter of the array pitch of the plasma generation nozzles 31 or the stub tuner units 37, or a pitch of one-eighth or one-sixteenth of the wavelength $\lambda G$.

FIG. 4 shows an example in which the array pitch of the plasma generation nozzles 31 and the stub tuner units 37 is set to $\lambda G/4$. Hence, the distance by which the stub tuner units 37 shift from the plasma generation nozzles 31 is $\lambda G/8$. In addition, FIG. 4 shows an example where the offset distance between the first straight line L1 and the second straight line L2 is set to $\lambda G/16$.

The stub tuner unit 37-0 is disposed near the outlet of the third waveguide piece 13 and reflects the microwave which has not been taken into any plasma generation nozzle 31-1 to 31-8. The stub tuner unit 37-0 is arranged at a position on the first straight line L1 and rearward away from the rearmost plasma generation nozzle 31-8. The distance between the stub tuner unit 37-0 and the plasma generation nozzle 31-8 equals to the array pitch of the plasma generation nozzles 31 (i.e., $\lambda G/4$ in the above described example of FIG. 4).

Herein, let's assume the number of the plasma generation nozzles 31 to be n. If they are counted from the side of the microwave generation unit 20, the (n−1)th plasma generation nozzle (i.e., the plasma generation nozzle 31-7 in the example of FIG. 1 to FIG. 3) probably takes in the least microwave energy of all the plasma generation nozzles 31. This is because the plasma generation nozzles 31-1 to 31-(n−1) on the front side from the (n−1)th plasma generation nozzle take in microwave energy one after another. This is also because the rearmost plasma generation nozzle 31-n is given a reflected microwave most intensely by the stub tuner unit 37-0 for reflection.

In one exemplary embodiment, energy is adjusted in such a way as described later by setting the (n−1)th plasma generation nozzle as a reference, and the stub tuner unit 37-(n−1) (i.e., the plasma generation nozzle 31-7 in FIG. 1 to FIG. 3) which corresponds to this (n−1)th plasma generation nozzle may not be used in the plasma generation unit.

Figure 5:
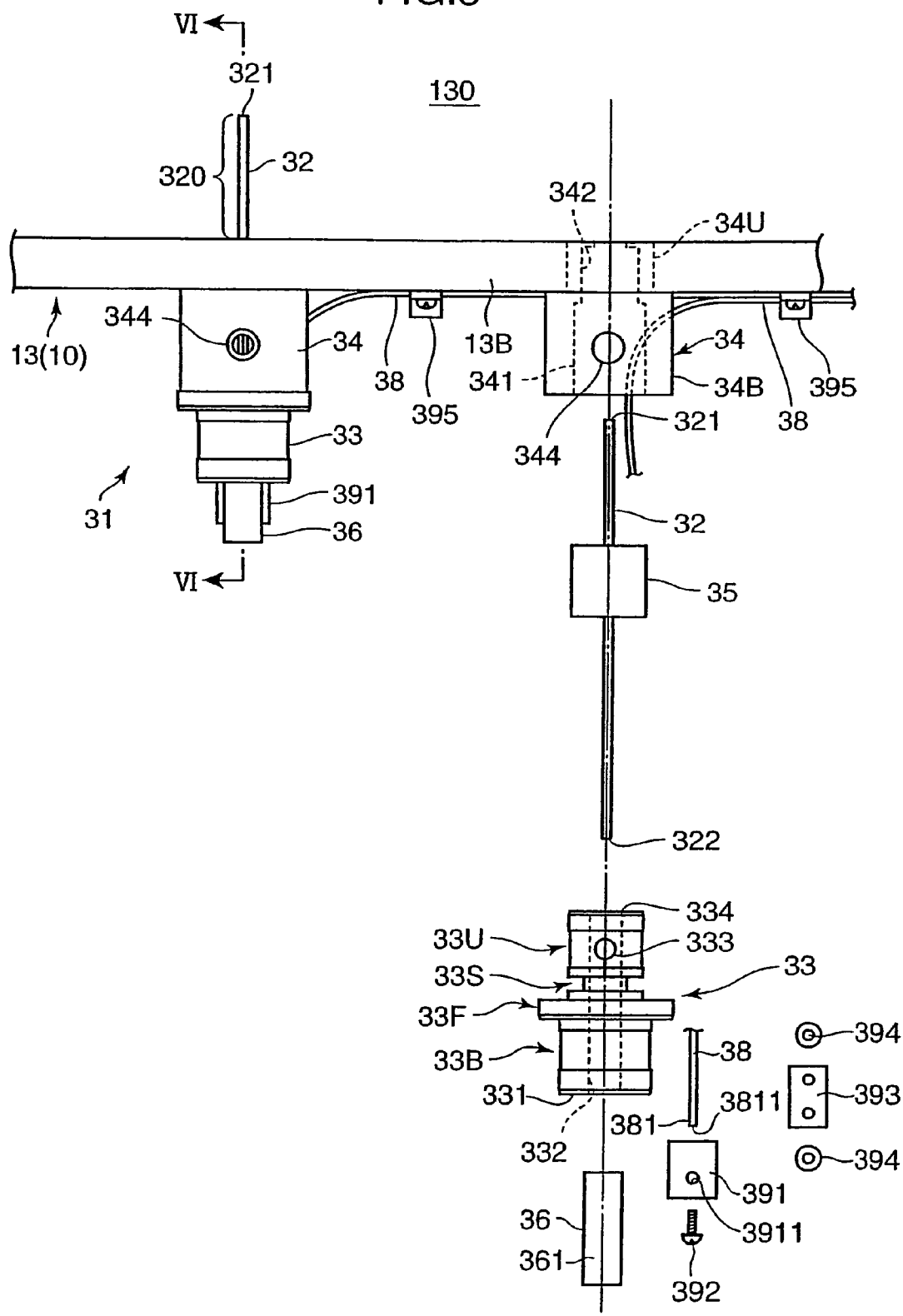
FIG. 5 is an enlarged side view of two plasma generation nozzles, one plasma generation nozzle being shown in an exploded view.
Figure 6:
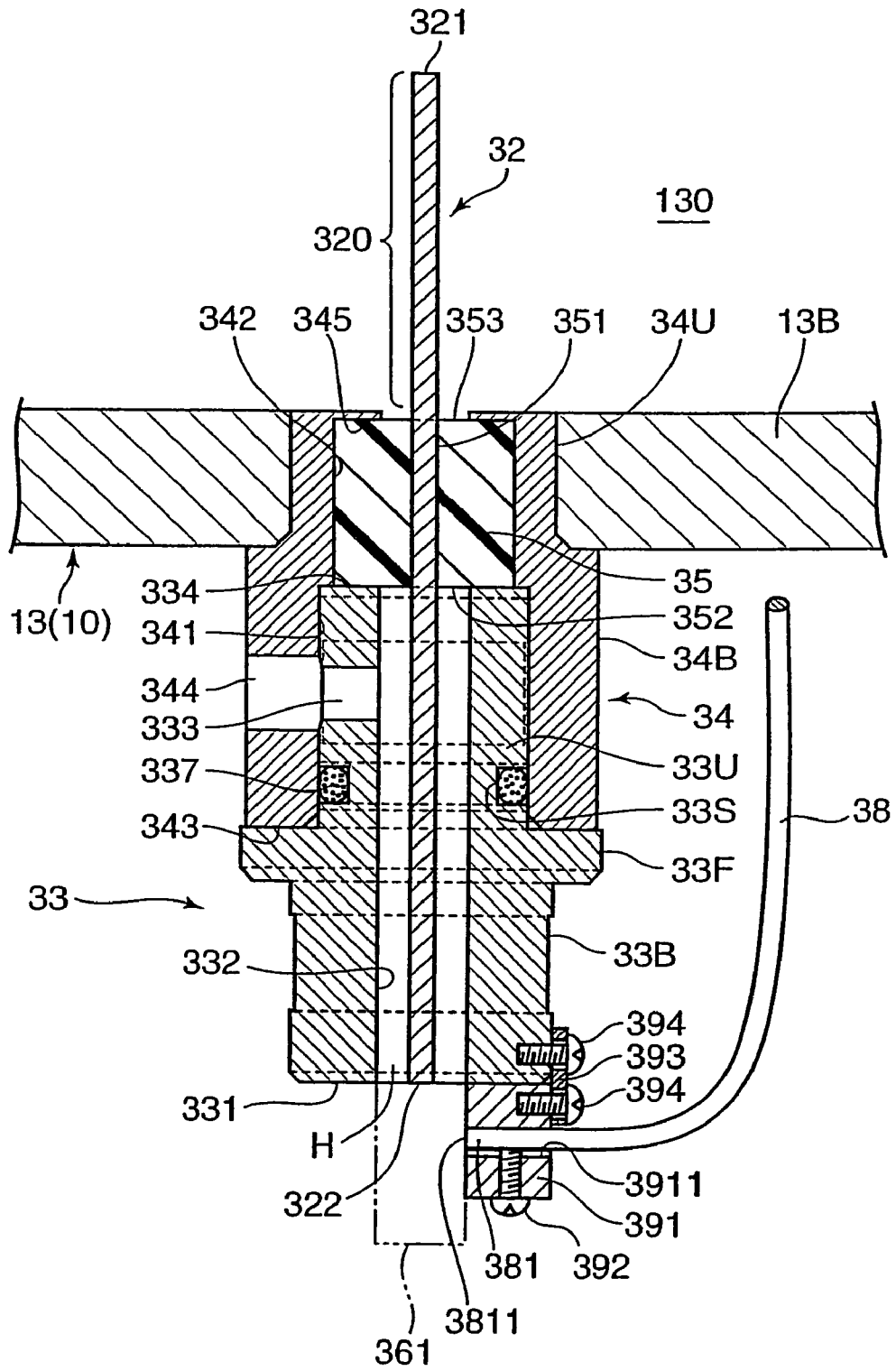
FIG. 6 is a sectional view, seen along the VI-VI line, of the plasma generation nozzle of FIG. 5.

FIG. 5 is an enlarged side view of two plasma generation nozzles 31 (one plasma generation nozzle 31 of which is shown in exploded view). FIG. 6 is a sectional view, taken along the VI-VI line of FIG. 5. The plasma generation nozzles 31 each include a center conductor 32 (i.e., an interior electric conductor), a nozzle body 33 (i.e., an external electric conductor), a nozzle holder 34, a seal member 35 and a protective tube 36.

The center conductor 32 is made of a conductive metal such as copper, aluminum and brass and is formed by a stick-shaped member. In one exemplary embodiment, the center conductor 32 may have a diameter of approximately 1 to 5 mm. An upper-end portion 321 of the center conductor 32 penetrates the lower plate 13B of the third waveguide piece 13 and protrudes by a predetermined length into a wave-guidance space 130 (herein, this protruding portion is referred to as a receiving antenna portion 320 which is a reception portion) On the other hand, a lower-end portion 322 of the center conductor 32 is disposed on substantially the same plane as a lower-end surface 331 of the nozzle body 33 in the up-and-down directions. In this center conductor 32, the receiving antenna portion 320 receives a microwave propagated inside of the waveguide 10. Thereby, it is supposed to be given microwave energy (i.e., microwave electric power) The center conductor 32 is held at its substantially middle part in the longitudinal directions by the seal member 35.

The nozzle body 33 is made of a conductive metal and is shaped like a pipe including a cylindrical space 332 which houses the center conductor 32. Besides, the nozzle holder 34 is also made of a conductive metal and is a cylindrical body which includes a lower hold space 341 with a relatively wide diameter for holding the nozzle body 33 and an upper hold space 342 with a relatively narrow diameter for holding the seal member 35. On the other hand, the seal member 35 is made of a heat-resistant resin such as Teflon (which is a registered trademark) or dielectric material such as ceramics. It is a cylindrical body which includes, along its central axis, a hold hole 351 for holding the center conductor 32 fixedly.

The nozzle body 33 is provided, in order from above, with: an upper trunk portion 33U which is fitted into the lower hold space 341 of the nozzle holder 34; a circular concave portion 33S for holding a gas seal ring 37 (described later); a flange portion 33F which protrudes in a circle; and a lower trunk portion 33B which protrudes from the nozzle holder 34. In the upper trunk portion 33U, a connection hole 333 is made which is used for supplying a known processing gas to the cylindrical space 332.

This nozzle body 33 functions as the external conductor disposed around the center conductor 32. The center conductor 32 is inserted on the central axis of the cylindrical space 332, in a state where a ring-shaped space H (i.e., an insulation interval) is secured around it. The nozzle body 33 is fitted into the nozzle holder 34, so that the peripheral part of the upper trunk portion 33U comes into contact with the interior-circumferential wall of the lower hold space 341 of the nozzle holder 34. At the same time, the nozzle body 33 is fitted into it so that the top surface of the flange portion 33F comes into contact with a lower-end surface 343 of the nozzle holder 34. It is desirable that the nozzle body 33 be fixed to the nozzle holder 34 so as to be freely attached and detached, for example, using a plunger, a set screw or the like.

The nozzle holder 34 includes an upper trunk portion 34U (substantially corresponding to the position of the upper hold space 342) which is tightly fitted into a penetrating hole 131 made in the lower plate 13B of the third waveguide piece 13, and a lower trunk portion 34B (substantially corresponding to the position of the lower hold space 341) which extends downward from the lower plate 13B. In the periphery of the lower trunk portion 34B, a gas supply hole 344 is formed which is used for supplying a processing gas to the ring-shaped space H.

As is not shown in any figure, to this gas supply hole 344, a tube joint or the like is attached which the end part of a gas supply pipe for supplying a known processing gas is connected to. The gas supply hole 344 and the connection hole 333 of the nozzle body 33 are positioned so as to lead to each other when the nozzle body 33 is fitted in place into the nozzle holder 34. In order to prevent a gas from leaking from the joint of the gas supply hole 344 and the connection hole 333, the gas seal ring 337 is placed between the nozzle body 33 and the nozzle holder 34.

In terms of these gas supply hole 344 and connection hole 333, several such holes may also be made at regular intervals in the circumferential directions. In addition, without forming such holes toward the center in the radius directions, as shown in the above described Japanese Patent Laid-Open Publication No. 2003-197397, they may also be formed tangentially to the exterior-circumferential surface of the cylindrical space 332 so that a processing gas whirls round. Besides, the gas supply hole 344 and the connection hole 333 may not be perpendicular to the center conductor 32. In order to make a processing gas flow more smoothly, they may also be formed slantwise from the side of the upper-end portion 321 to the side of the lower-end portion 322.

The seal member 35 is held in the upper hold space 342 of the nozzle holder 34, so that a lower-end surface 352 of the seal member 35 comes into contact with an upper-end surface 334 of the nozzle body 33, and so that an upper-end surface 353 of the seal member 35 comes into contact with an upper-end engagement portion 345 of the nozzle holder 34. In other words, the seal member 35 supporting the center conductor 32 is fitted into the upper hold space 342. Thus, the lower-end surface 352 is pressed by the upper-end surface 334 of the nozzle body 33.

The protective tube 36 is formed by a transparent quartz glass pipe with a predetermined length and the like. It has an external diameter which is substantially equal to the internal diameter of the cylindrical space 332 of the nozzle body 33. This protective tube 36 has the function of preventing an abnormal discharge (e.g., an arc discharge) at the lower-end surface 331 of the nozzle body 33 and radiating a plasma plume P (mentioned later) normally. It is inserted into the cylindrical space 332 so that a part of the protective tube 36 protrudes from the lower-end surface 331 of the nozzle body 33. Incidentally, the whole protective tube 36 may also be housed in the cylindrical space 332 so that its tip comes to the same position as the lower-end surface 331 or comes into the inside from the lower-end surface 331.

Figure 7:
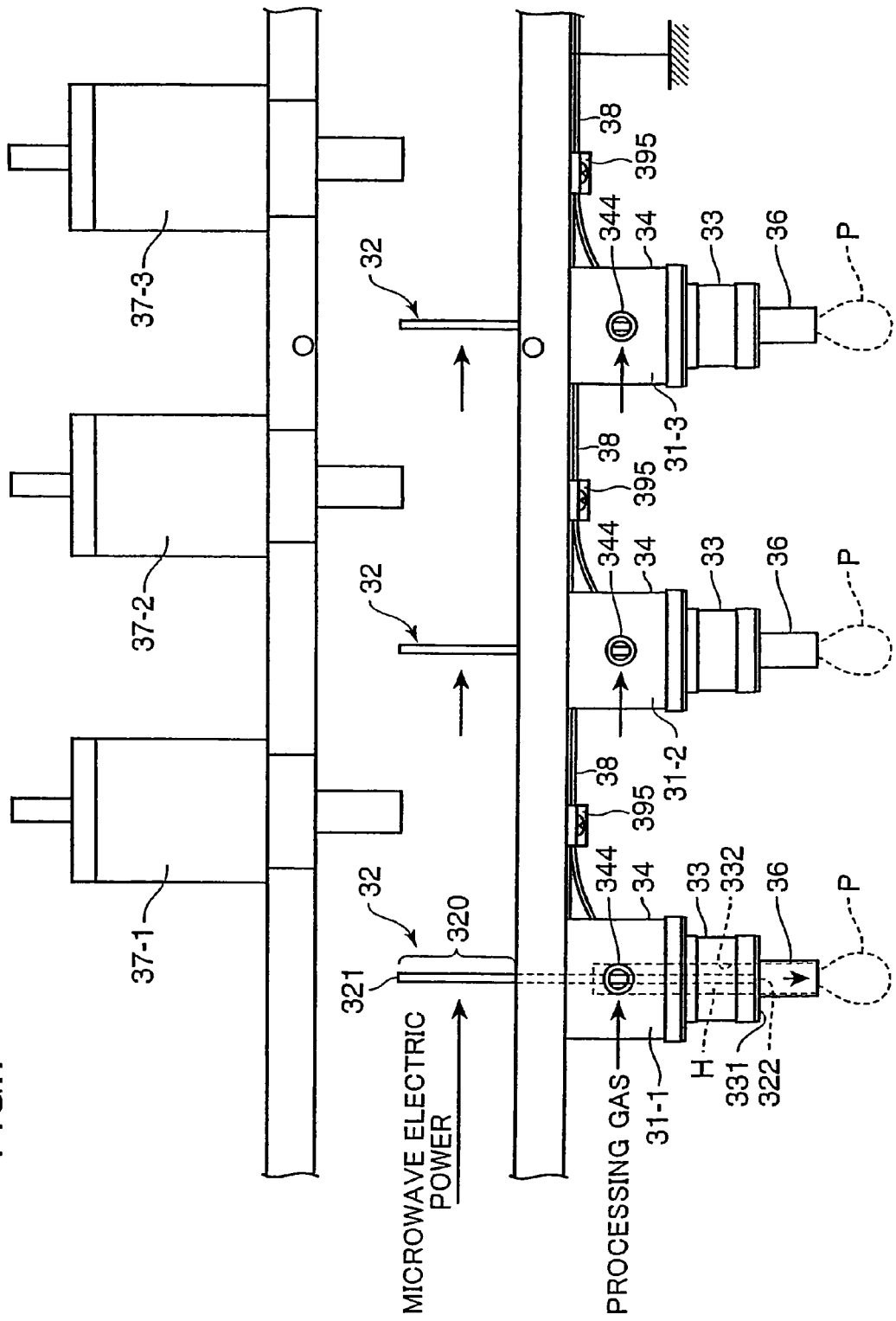
FIG. 7 is a schematic side view of plasma generation, showing a plasma-generation state.

The plasma generation nozzle 31 is configured as described above, and consequently, the nozzle body 33, the nozzle holder 34 and the third waveguide piece 13 (i.e., the waveguide 10) are kept electrically connected (i.e., they have the same electric potential). On the other hand, the center conductor 32 is supported by the insulating seal member 35, and thus, the former are electrically insulated from the latter members. Hence, as shown in FIG. 7, with the waveguide 10 grounded, if a microwave is received by the receiving antenna portion 320 of the center conductor 32 and the microwave electric power is supplied to the center conductor 32, then an electric-field concentrated part is formed near its lower-end portion 322 and the lower-end surface 331 of the nozzle body 33.

In this state, for example, if an oxygen-system processing gas such as an oxygen gas and air is supplied from the gas supply hole 344 to the ring-shaped space H, then the microwave electric power excites the processing gas, thereby generating plasma (i.e., an ionized gas) near the lower-end portion 322 of the center conductor 32. This plasma has an electron temperature of tens of thousands degrees, but its gas temperature is close to an external temperature. Hence, it is reactive plasma (i.e., plasma in which its electron temperature determined by the electrons is far higher than the gas temperature determined by the neutral molecules), and it is plasma generated under an atmospheric pressure.

The thus generated plasma gas for processing is ejected or radiated as the plasma plume P from the lower-end surface 331 of the nozzle body 33, using a gas flow given from the gas supply hole 344. This plasma plume P contains a radical, and for instance, oxygen radical is generated if an oxygen-system gas is used as the processing gas. This helps the plasma plume P have the function of decomposing and removing an organic matter, a resist-removing function, or the like. In the plasma generation unit PU according to this embodiment, a plurality of such plasma generation nozzles 31 are disposed, so that a line of such plumes P extending in the right-and-left directions can be generated.

In one exemplary embodiment, if an inert gas, such as an argon gas or a nitrogen gas, is used as the processing gas, so that, in various substrates, their surfaces can be cleaned, or the surface qualities can be reformed. In another exemplary embodiment, a compound gas containing fluorine is used so that the substrate can have a water-repellent surface. In yet another exemplary embodiment, a compound gas containing a water-affinity group is used so that the surface of a substrate can be changed to a water-affinity surface. In still another exemplary embodiment, a compound gas containing a metallic element is used so that a metal thin-film layer can be formed on a substrate.

To each plasma generation nozzle 31, one end 381 of the optical fiber 38 is attached so as to face the above described protective tube 36 attached to the tip thereof. This one end 381 of the optical fiber 38 is supported to a support member 391 attached to the lower-end surface 331 of the nozzle body 33, so that an end surface 3811 thereof is stuck fast to a peripheral surface 361 of the transparent protective tube 36. The one end 381 is treated suitably with ferrule or the like. It is inserted through an insertion hole 3911 of the support member 391 and is fixed by means of a screw or the like.

The support member 391 is fixed to the lower-end surface 331 of the nozzle body 33, by means of an attachment member 393, a screw 394 and the like. The optical fiber 38 is suitably drawn around so as not to interfere with a gas supply pipe 922 or the like (mentioned later) connected to the gas supply hole 344. Then, it is attached, using wire-attachment fittings 395, to the lower plate 13B of the third waveguide piece 13.

The dummy loads 40 and 60 are each a water-cooled (or air-cooled) electronic-wave absorber which absorbs the above described reflected microwave and converts it into heat. In these dummy loads 40 and 60, cooling-water flow holes 41 and 61 for letting cooling water flow inside are provided, respectively. Hence, a heat exchange is made between the heat produced by converting the received microwave and that of this cooling water. Using such a dummy load 40, the end of the waveguide 10 is designed to be a reflection-free end.

The circulator 50 is formed, for example, by a three-port circulator of a waveguide type which has a ferrite pillar built-in. In terms of a microwave which is once propagated toward the plasma generation portion 30, the residual microwave power that is not consumed in the plasma generation portion 30. Then, such residual microwave may be returned as a reflected microwave. The circulator 50 brings the reflected microwave to the dummy load 60 without returning it to the microwave generation unit 20. Since this circulator 50 is provided, the reflected microwave can be prevented from overheating the microwave generation unit 20.

Figure 8:
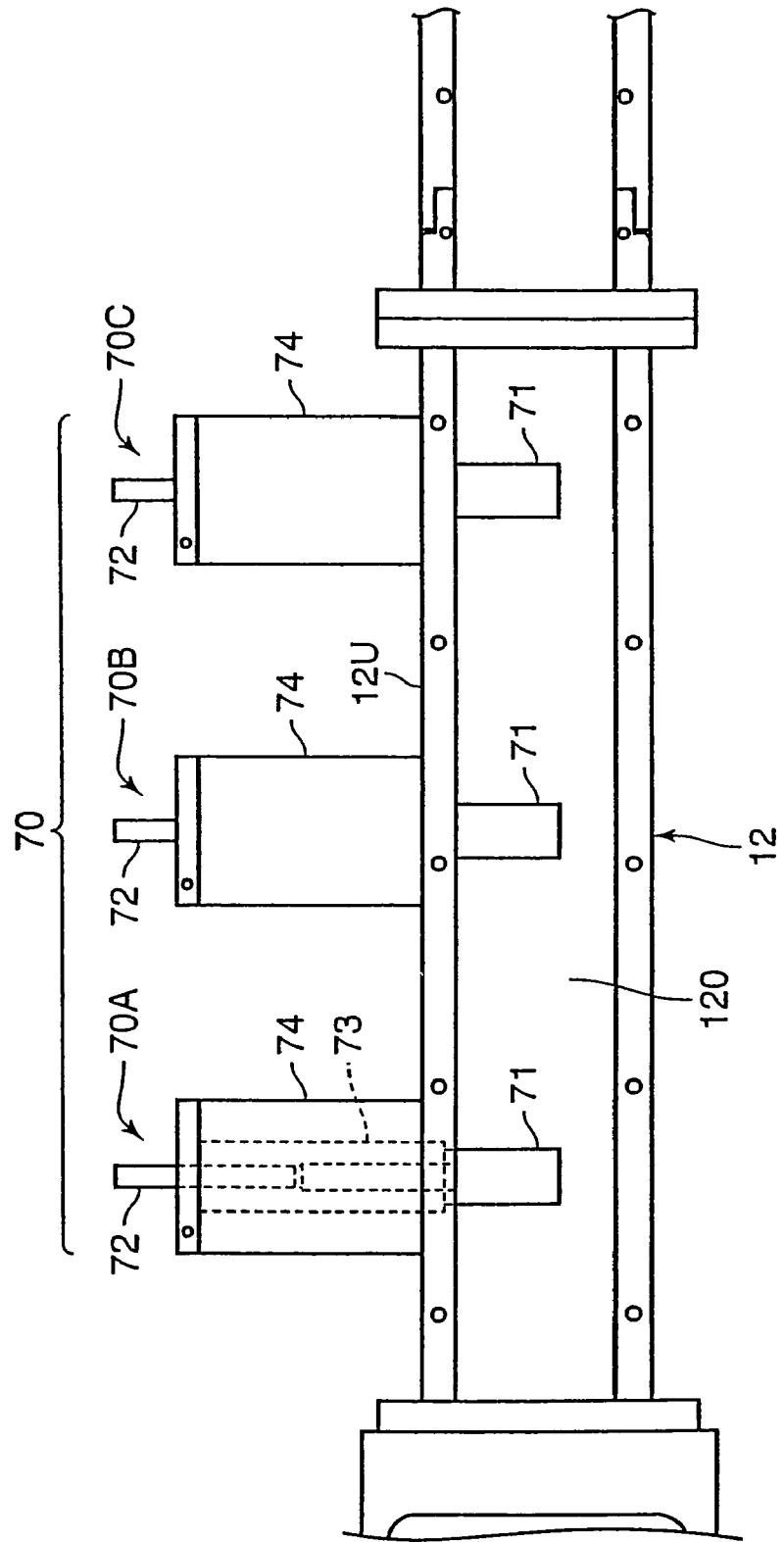
FIG. 8 is a schematic side view of a stub tuner, showing its disposition.

The stub tuner 70 is used for making an impedance match between the waveguide 10 and the plasma generation nozzle 31. It is provided with three stub tuner units 70A to 70C which are arranged in series at predetermined intervals on an upper plate 12U of the second waveguide piece 12. FIG. 8 is a schematic side view of the stub tuner 70, showing its disposition. As shown in this figure, the three stub tuner units 70A to 70C have the same structure. They are each formed by: a stub 71 which protrudes a waveguide space 120 of the second waveguide piece 12; an operation stick 72 which is directly connected to this stub 71; a moving mechanism 73 which moves the stub 71 in the up-and-down directions; and an outside cover 74 which holds those members.

In terms of the stubs 71 provided in the stub tuner units 70A to 70C, their protrusion lengths in the wave-guidance space 120 can be independently adjusted by each operation stick 72. The protrusion lengths of these stubs 71 are determined, for example, by monitoring the microwave electric power and simultaneously searching a point at which the microwave power consumed by the plasma comes to the maximum (i.e., a point at which the reflected microwave comes to the minimum).

Each stub tuner unit 37-0 to 37-8 may have a configuration similar to the stub tuner units 70A to 70C. In one exemplary embodiment, the protrusion length of each of the stub tuner units 37-1 to 37-8 into the third waveguide piece 13 can be electrically adjusted using a stepping motor in this example.

The carrying means C includes the several carriage rollers 80 which are disposed along a predetermined carriage path. The carriage rollers 80 are driven by a driving means (not shown). Thereby, the work W to be processed is carried via the plasma generation portion 30. Herein, as the work W to be processed, there can be exemplified a flat substrate such as a plasma display panel and a semiconductor wafer, a circuit wiring board on which electronic parts are mounted, and the like. Besides, non-flat parts, assembled parts or the like can also be processed, and in that case, such carriage rollers can be replaced with a belt conveyer or the like.

Figure 9:
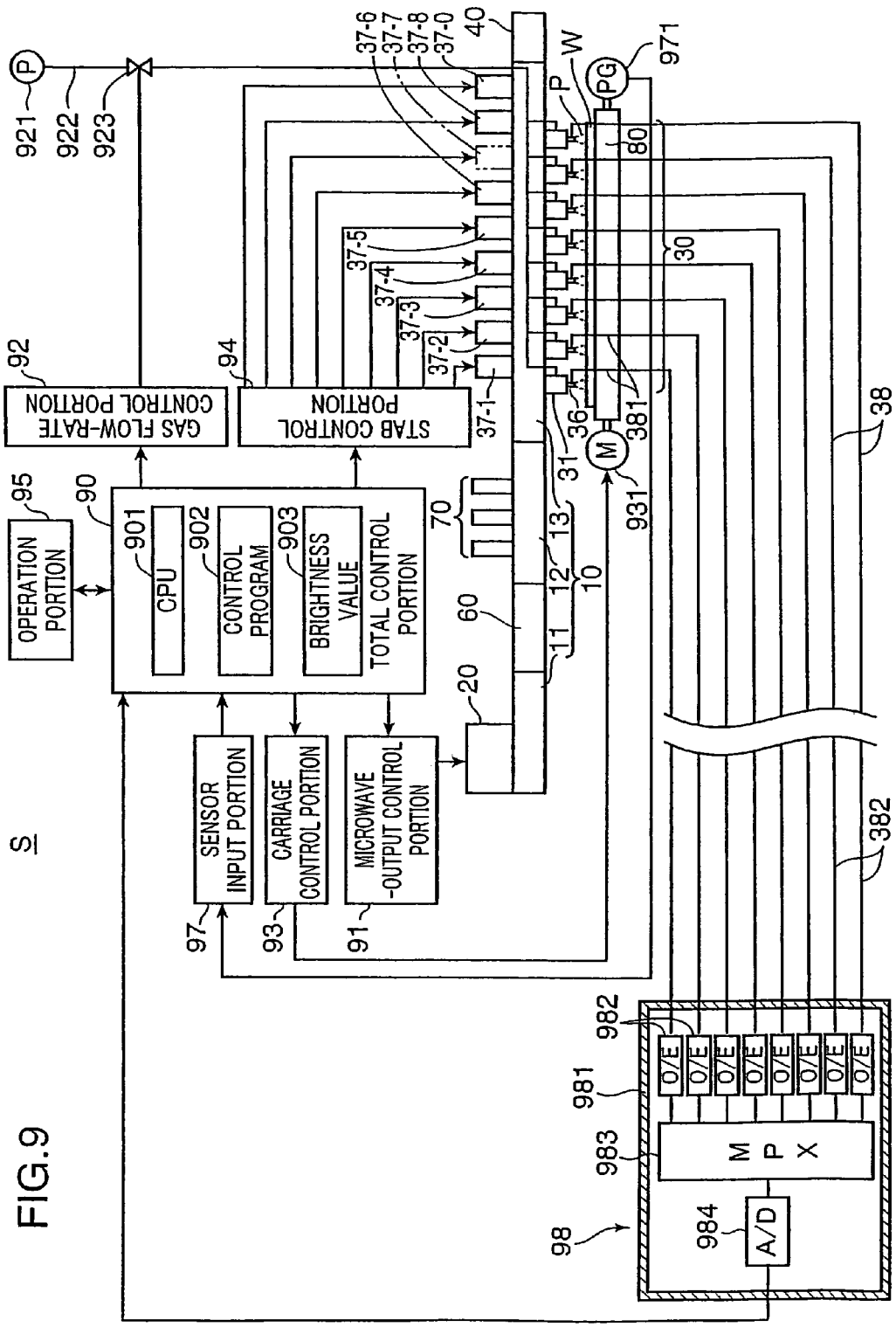
FIG. 9 is a block diagram, showing a control system of the work processing apparatus.

Next, a description will be given about the electrical configuration of the work processing apparatus S according to this embodiment. FIG. 9 is a block diagram, showing a control system of the work processing apparatus S. This control system includes: a total control portion 90 which has a CPU (or central processing unit) 901, its peripheral circuits and the like; a microwave-output control portion 91 which is made up of an output interface, a drive circuit and the like; a gas flow-rate control portion 92 and a carriage control portion 93; and a stub control portion 94. In addition to these, the work processing apparatus S is provided with: an operation portion 95 which includes a display portion, an operation panel and the like, and gives a predetermined operation signal to the total control portion 90; sensor input portions 97, 98 which are each made up of an input interface, an analog/digital converter and the like; a sensor 971; and a drive motor 931; and a flow-rate control valve 923.

The microwave-output control portion 91 executes the ON-OFF control and output-intensity control of a microwave outputted from the microwave generation unit 20. It generates an electromagnetic wave signal which has the above described frequency of 2.45 GHz, for instance, and executes the operation control of the generation of a microwave by the unit body portion 21 of the microwave generation unit 20.

The gas flow-rate control portion 92 controls the flow rate of a processing gas supplied to each plasma generation nozzle 31 of the plasma generation portion 30. Specifically, it controls the opening and closing, or regulates the opening level, of the flow-rate control valve 923 disposed in a gas supply pipe 922 which connects a processing-gas supply source 921 such as a gas cylinder and each plasma generation nozzle 31.

The carriage control portion 93 controls the operation of the drive motor 931 which rotates the carriage rollers 80. It controls the start and stop of the carriage of the work W, the carriage speed and the like.

The stub control portion 94 gives a drive signal to a stepping motor added to each stub tuner unit 37-1 to 37-8. Thereby, it controls the protrusion length of each stub of the unit into the third waveguide piece 13.

The total control portion 90 governs the total operation control of the work processing apparatus S. In response to an operation signal given from the operation portion 95, it monitors the result of a measurement of the carriage speed of the work W by the speed sensor 971 which is inputted from the sensor input portion 97 and the lighting state of plasma (i.e., the light emitted from the plasma plume P) in each plasma generation nozzle 31 which is inputted from the sensor input portion 98, and the like. Based on a predetermined sequence, it controls the operation of the microwave-output control portion 91, the gas flow-rate control portion 92 and the carriage control portion 93 and the stub control portion 94.

Specifically, on the basis of a control program stored beforehand in a memory 902, via the carriage control portion 93, the CPU 901 executes control so as to revolve the drive motor 931 at constant speed, lead the work W to the plasma generation portion 30. Then, via the gas flow-rate control portion 92, it allows the flow-rate control valve 923 to supply a processing gas at a predetermined flow rate to each plasma generation nozzle 31. Simultaneously, via the microwave-output control portion 91, it allows the microwave generation unit 20 to generate a microwave with a predetermined intensity. Thereby, plasma (i.e., the plasma plume P) is generated in each plasma generation nozzle 31. Consequently, while the work W is being carried, the plasma plume P can be radiated onto its surface. This makes it possible to process a plurality of such works W continuously.

At this time, the CPU 901 monitors the lighting state of plasma which is detected by the optical fiber 38 provided in each of the plurality of plasma generation nozzles 31. In a memory 903 provided in the total control portion 90, a brightness value is stored for obtaining a desirable plume size or shape measured and stored beforehand by the side of a manufacturer. The CPU 901 reads this brightness value, and in order to obtain the brightness value, it controls the stub protrusion length of each stub tuner unit 37-1 to 37-8. Thereby, the energy consumed by each plasma generation nozzle, in other words, the size of the plasma plume P to be generated, becomes uniform, so that uniformity can be obtained in this example.

To the sensor input portion 98 are connected the other ends 382 of the optical fibers 38. The sensor input portion 98 is apart from the plasma generation nozzles 31 and is covered in a shielding case 981. Using a digital signal, it gives the detected brightness value to the total control portion 90.

To the sensor input portion 98, the other end 382 of each optical fiber 38 is connected. It includes: photoelectric conversion elements 982, such as a photo-diode, each of which outputs at least either a voltage or an electric current corresponding to the brightness of the plasma plume P; a multiplexer 983 which selects, by the method of time division, at least either a voltage or an electric current obtained by each photoelectric conversion element 982; and an analog/digital converter 984 which allows an output from the multiplexer 983 to undergo an analog-to-digital conversion.

An operation will be described of the work processing apparatus S having such a configuration. First, on the first straight line L1 where each plasma generation nozzle 31-1 to 31-8 of the waveguide 10 is set in array, the stub tuner unit 37-0 which is the microwave reflection member is provided on the rear side from the rearmost plasma generation nozzle 31-8. Thereby, a mirror image is created for a microwave which becomes feebler as it goes apart from the microwave generation unit 20. This helps restrain the intensity of the microwave from lowering in the plasma generation nozzles 31-8, 31-7, on the rear side.

Next, on the rear side from each plasma generation nozzle 31-1 to 31-8 on the second straight line L2 which is offset from the first straight line L1, the stub tuner units 37-1 to 37-8 are disposed so as to correspond to each nozzle. The stub protrusion length of each unit is controlled in accordance with the size of the plasma plume P detected through the optical fiber 38. This helps regulate the percentage of the mutual interference between the plasma generation nozzles where each stub is located. Hence, using such a simple configuration of the stub tuner units 37-0 to 37-8, the energy consumed by each plasma generation nozzle, in other words, the size of the plasma plume P to be generated, becomes uniform, so that uniformity can be obtained in this example.

Incidentally, unless the stub tuner units 37-0 to 37-8 are provided, each plasma generation nozzle 31-1 to 31-8 receives, for example, twenty percent of the propagated microwave, and the remaining eighty percent passes on. Then, the stub tuner unit 37-0 reflects, for example, a hundred percent of the propagated microwave. Each stub tuner unit 37-1 to 37-8 reflects, if the stub protrudes at the maximum, for example, sixty percent toward the front side in the direction where the microwave is propagated. Thus, forty percent passes toward the rear side.

The interaction between the stub tuner units 37-0 to 37-8 and the plasma generation nozzles 31-1 to 31-8 may be affected by various parameters, such as the reflectance ratio or a reception ratio. It may be also affected by the phase of an incident wave and a reflected wave of the microwave. Besides, it can be also affected by the electricity-reception efficiency or reflectance ratio of each plasma generation nozzle 31-1 to 31-8 itself, as well as the disposition of each portion. Therefore, the design and/or operational parameters, such as how each stub tuner unit 37-0 to 37-8 is disposed, how long each stub protrudes, or the like, may be suitably determined according to apparatus characteristics, experiential values or the like.

In the one exemplary embodiment, the protrusion length of each stub of the stub tuner units 37-1 to 37-8 into the waveguide 10 can be adjusted through a motor operation. In each plasma generation nozzle 31-1 to 31-8, the lighting state of plasma is detected by the optical fiber 38. In response to this detection result, the CPU 901 executes feedback-control of the stub protrusion length of the stub tuner units 37-1 to 37-8 on the rear side from the corresponding plasma generation nozzles 31-1 to 31-8. Therefore, the energy consumed by each plasma generation nozzle 31-1 to 31-8 or the size of the plasma plume P to be generated becomes uniform automatically. In addition, the light of plasma can be detected being on, or not being off carelessly.

Furthermore, a microwave generated from the microwave generation unit 20 is received by the center conductor 32 provided in each plasma generation nozzle 31. On the basis of the energy of the microwave, a plasmatic gas is emitted from each plasma generation nozzle 31. Therefore, the transfer of the energy of the microwave to each plasma generation nozzle 31 can be simplified. This makes it possible to simplify the configuration of the apparatus, thus reducing the costs, and realizing another advantageous effect.

Moreover, the plasma generation portion 30 made up of the plurality of plasma generation nozzles 31 arranged in a line has a width substantially equal to the size t of the flat work W in the width direction perpendicular to the direction in which it is carried. Therefore, once the carrying mechanism C allows this work W to pass through the plasma generation portion 30, the processing of its whole surface can be completed. This helps remarkably enhance the efficiency of a plasma processing for a flat work. Besides, a plasmatic gas can be radiated in the same timing to the work W which comes being carried, so that a homogenous surface processing or the like can be executed.

Hereinbefore, a description is given about the work processing apparatus S according to an embodiment of the present invention. However, the present invention is not limited to this, and thus, for example, the following embodiments can be adopted.

(1) In the above described embodiment, an example is shown in which the plasma generation nozzles 31 and the stub tuner units 37 are disposed in the waveguide 10 (i.e., the third waveguide piece 13) so as to be set in array on the first straight line L1 and the second straight line L2, respectively, which are a predetermined distance apart from and parallel to each other. Instead of this, the plasma generation nozzles 31 and the stub tuner units 37 may also be attached to the waveguide 10 so as to be arranged on a single straight line.

Figure 10:
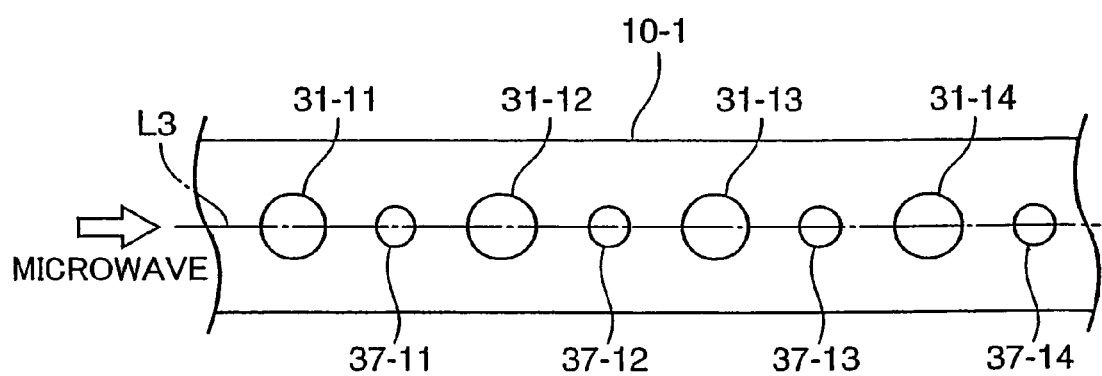
FIG. 10, FIGS. 11A and 11B and FIG. 12 are a plan view of a wave guide, plasma generation nozzles and stub tuner units, illustrating other variations in their arrangement in the wave guide.

FIG. 10 shows a variation in the arrangement of the above described plasma generation nozzles and stub tuner units. Herein, on a third straight line L3 which corresponds to the center line of a waveguide 10-1 in its longitudinal direction and runs along the direction where a microwave is propagated, plasma generation nozzles 31-11, 31-12, 31-13, 31-14 are each set in array at a known interval. In addition, on the same third straight line L3, in a rear position from each nozzle in the direction where the microwave is propagated, stub tuner units 37-11, 37-12, 37-13, 37-14 are each set in array, respectively.

Incidentally, even in this variation, in the same way as described in FIG. 4, preferably, for example, these plasma generation nozzles and stub tuner units can be arranged at a pitch of half or quarter of the wavelength λG of a microwave, respectively. Besides, the distance between each plasma generation nozzle and each stub tuner unit can be a pitch of quarter or one-eighth of the wavelength λG, for instance.

Likewise in this variation, if the length by which each stub provided in the stub tuner units 37-11 . . . protrudes into the waveguide 10-1 is adjusted, the power of the plasma generation nozzles 31-11 . . . can be adjusted. In addition, in this variation, the plasma generation nozzles and stub tuner units are arranged on the single third straight line L3. This offers an advantage in that holes for nozzle and stub attachment can be more easily made in the waveguide 10-1, thus enhancing the productivity.

(2) Furthermore, the plurality of plasma generation nozzles 31 may also be disposed in parallel, in a zigzag form or at random in the waveguide 10 (i.e., the third waveguide piece 13). In an optimum position around each plasma generation nozzle 31, the stub tuner units 37 can each be disposed.

Figure 11A:
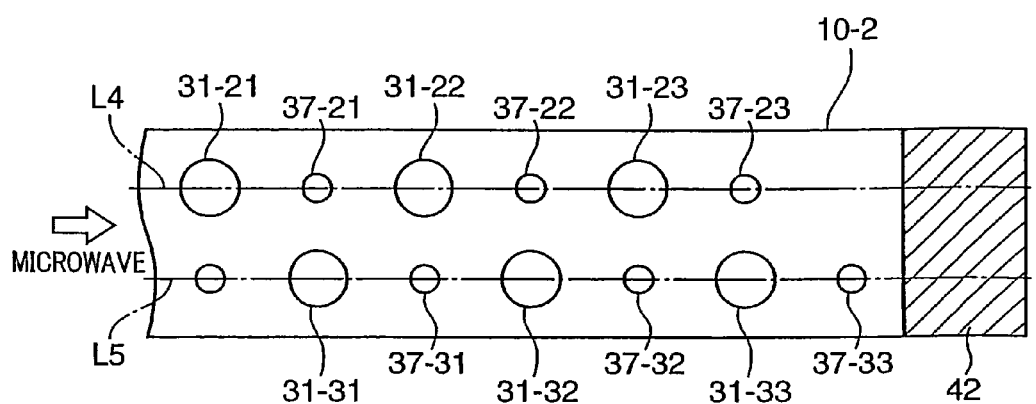
Figure 11B:
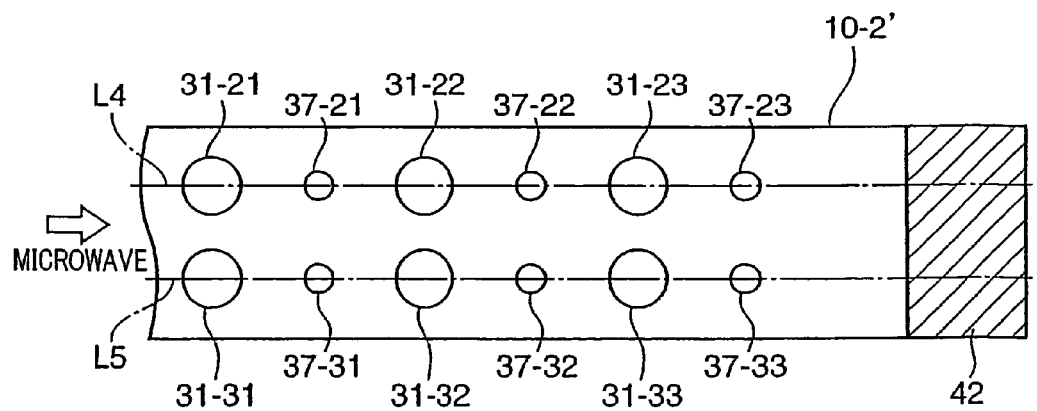

FIGS. 11A, 11B show other variations in the arrangement of plasma generation nozzles and stub tuner units. Examples are given in which the plasma generation nozzles 31 are each attached in array on a fourth straight line L4 and a fifth straight line L5 along the direction where a microwave is propagated. Then, the stub tuner units 37 are disposed so as to correspond to each plasma generation nozzle 31 in a rear position in the direction where the microwave is propagated.

In detail, in FIG. 11A, on the fourth straight line L4 of a waveguide 10-2, plasma generation nozzles 31-21, 31-22, 31-23 are each set in array at an interval. On the fourth straight line L4 as well, in a rear position from each nozzle in the direction where the microwave is propagated, stub tuner units 37-21, 37-22, 37-23 are each set in array, respectively. In the same way, on the fifth straight line L5, plasma generation nozzles 31-31, 31-32, 31-33 and stub tuner units 37-31, 37-32, 37-33 are arranged.

In the one exemplary embodiment, the array pitch of the plasma generation nozzles 31-21, 31-22, 31-23 on the fourth straight line L4 is equal to the array pitch of the plasma generation nozzles 31-31, 31-32, 31-33 on the fifth straight line L5. However, behind the former, the latter are arranged so as to shift by half the pitch, respectively. Consequently, in the waveguide 10-2, such plasma generation nozzles are arranged in a zigzag form in top view. Incidentally, the end of the waveguide 10-2 is designed to be a reflection-free end 42 so that the microwave electric power can be easily regulated.

FIG. 11B shows an example in which plasma generation nozzles 31-21, 31-22, 31-23 on the fourth straight line L4 of a waveguide 10-2' are arranged in parallel with plasma generation nozzles 31-31, 31-32, 31-33 on the fifth straight line L5. In other words, this is an example where two nozzles and their corresponding two stub tuner units are arranged side by side in the direction perpendicular to the direction where a microwave is propagated.

Figure 12:
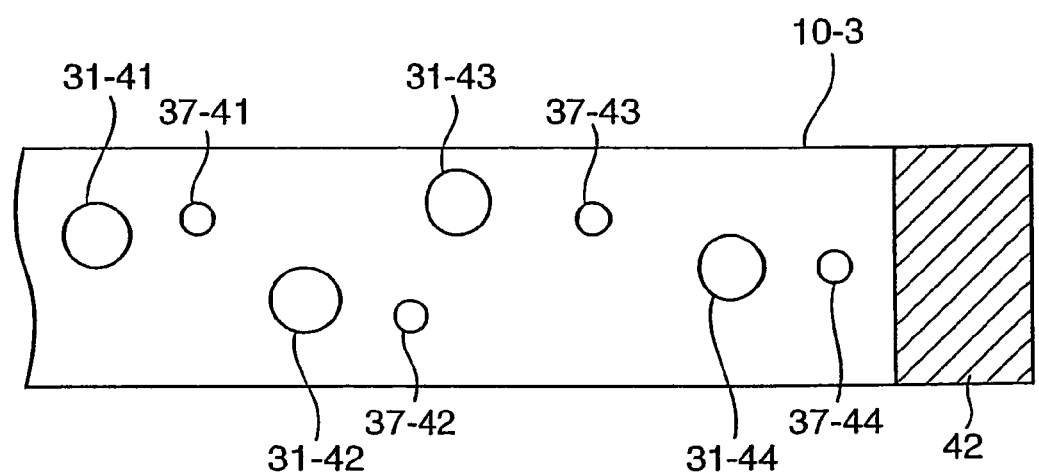

FIG. 12 shows still another variation in the arrangement of plasma generation nozzles and stub tuner units. Herein, an example is given in which plasma generation nozzles 31-41, 31-42, 31-43, 31-44 are arranged at random in a waveguide 10-3, and in an optimum rear position around each such nozzle, stub tuner units 37-41, 37-42, 37-43, 37-44 are disposed, respectively.

As described above, according to the variations shown in FIGS. 11A, 11B and FIG. 12, there is an advantage in that plasma generation nozzles can be more freely disposed. Incidentally, in these variations, if a microwave is reflected from an end of a waveguide, the power is frequently difficult to regulate. Hence, it is especially desirable that the reflection-free end 42 such as a dummy load be provided.

(3) In the above described embodiment, an example is shown in which the carrying mechanism C which carries the work W is used as the moving means, and as the carrying mechanism C, the work W is placed and carried on the upper surface of the carriage rollers 80. In addition to this, for example, the work W may also be nipped and carried between upper and lower carriage rollers. Without using any carriage rollers, the work W may also be stored a predetermined basket or the like. Then, the basket or the like is carried by a line conveyer or the like. Alternatively, the work W may also be grasped by a robot hand or the like to carry it to the plasma generation portion 30. Alternatively, as the moving means, the side of the plasma generation nozzles 31 may also be designed to make a motion. In other words, the work W and the plasma generation nozzles 31 may also move relatively to each other on the plane (i.e., the X-Y plane) that intersects the plasma irradiation direction (i.e., the Z direction).

(4) In the above described embodiment, a magnetron which generates a microwave with a frequency of 2.45 GHz is illustrated as the microwave generation source. However, various high-frequency power sources other than a magnetron can also be used. Besides, a microwave having a different frequency from 2.45 GHz may also be used.

(5) In order to measure a microwave electric power inside of the waveguide 10, desirably, a wattmeter should be provided in a proper place of the waveguide 10. For example, in order to detect the ratio of a reflected-microwave electric power to a microwave electric power emitted from the microwave transmission antenna 22 of the microwave generation unit 20, a waveguide in which a wattmeter is embedded can be placed between the circulator 50 and the second waveguide piece 12.

Herein, the above described specific embodiment mainly includes the invention which has the following configurations.

A plasma generator according to an aspect of the present invention, comprising: a waveguide for propagating a microwave therethrough; a plurality of plasma generation nozzles secured to the waveguide and operative to receive processing gas and excite the processing gas into plasma using the microwave; and a plurality of stubs secured to the waveguide, one or more of the stubs being disposed around a corresponding one of the nozzles and operative to control an amount of microwave taken by the corresponding nozzle.

In addition, a work processing apparatus according to another aspect of the present invention which irradiates a work with plasma to give a predetermined processing to the work, comprising: the plasma generator having the above described configuration; and a moving mechanism which moves the work and the plasma generator relatively on a plane that intersects a direction where the plasma generator emits the plasmatic gas.

According to the above described configuration, the stubs correspond to a part or the whole part of the plurality of plasma generation nozzles and are each disposed in a rear position in the direction where the microwave is propagated. Therefore, the protrusion length of each stub into the waveguide is adjusted, so that the energy consumed by each plasma generation nozzle, in other words, the size of a plume to be generated, can be adjusted. This makes it possible, for example, to unify the output power of each plasma generation nozzle. Consequently, if this plasma generator is applied to the work processing apparatus, a processing can be uniformly given to the work W.

In the above described configuration, it is desirable that: the plasma generation nozzles be attached in array on a first straight line along the direction where the microwave is propagated; and the stubs be attached in array on a second straight line parallel to the first straight line which is offset from the first straight line.

In this case, desirably, a microwave reflection member should be provided which is disposed in a rear position from the rearmost plasma generation nozzle on the first straight line. Thereby, the reflection member creates a mirror image for a microwave which becomes feebler as it goes apart from the microwave generation unit, so that the intensity of the microwave can be restrained from lowering in the plasma generation nozzles on the rear side.

Furthermore, it is desirable that: in the case where the wavelength of the microwave is $\lambda G$, the plasma generation nozzles and stubs be each set in array at a pitch of $\lambda G/4$; the distance by which the stubs shift from the plasma generation nozzles in the direction where the microwave is propagated be $\lambda G/8$; and the second straight line be a straight line which is offset by $\lambda G/16$ from the first straight line. According to this configuration, the energy consumed by each plasma generation nozzle, or the size of a plume to be generated, can be easily unified.

In the above described configuration, the plasma generation nozzles and stubs can be configured so as to be attached in array on a third straight line along the direction where the microwave is propagated. According to this configuration, holes for attaching the plasma generation nozzles and the stubs can be more easily made in the waveguide, thus enhancing the productivity.

Moreover, in the above described configuration, the plasma generation nozzles can be attached non-linearly along the direction where the microwave is propagated, and the stubs can correspond to each plasma generation nozzle and each be disposed in a rear position in the direction where the microwave is propagated.

Alternatively, the plasma generation nozzles can each be attached in array on a plurality of straight lines along the direction where the microwave is propagated, and the stubs can correspond to each plasma generation nozzle and each be disposed in a rear position in the direction where the microwave is propagated.

According to these configurations, the plasma generation nozzles can be more freely disposed in the waveguide.

In this case, in order to facilitate the power regulation by restraining the microwave from reflecting from the end of the waveguide, desirably, the end of the waveguide in the direction where the microwave is propagated should be a reflection-free end.

In the above described configuration, it is desirable that the protrusion length of each stub into the waveguide is adjustable.

In the above described configuration, it is desirable that the plasma generator be further provided with: an adjustment mechanism which adjusts, through a electrical operation, the protrusion length of each stub into the waveguide; a photo-sensor which is disposed in each plasma generation nozzle to detect a lighting state of plasma; and a control portion which controls the protrusion length of each stub in response to a detection result of the photo-sensor.

According to the above described configuration, in response to a detection result by each photo-sensor, the control portion can execute feedback-control of the protrusion length of each stub on the rear side from its corresponding plasma generation nozzle. Therefore, the energy consumed by each plasma generation nozzle, in other words, the size of a plume to be generated, can be automatically unified. In addition, the light of plasma can be detected being on, or not being off carelessly.

INDUSTRIAL APPLICABILITY

The work processing apparatus and plasma generator according to the present invention can be suitably applied to an etching apparatus or a film formation apparatus for a semiconductor substrate such as a semiconductor wafer, a cleaning apparatus for a glass substrate such as a plasma display panel or a printed wiring board, a sterilization apparatus for medical equipment or the like, a protein decomposition apparatus, and the like.

The invention claimed is:

1. A plasma generation device, comprising:
   a waveguide for propagating a microwave there through, the waveguide including a first waveguide portion and a second waveguide portion downstream from the first waveguide portion;
   a plurality of plasma generation nozzles secured along a first longitudinal length of the second waveguide portion and operative to receive processing gas and excite the processing gas into plasma using the microwave; and
   a plurality of stubs secured to the waveguide, the plurality of stubs including:
   a plurality of first stubs secured to the first waveguide portion and making an impedance match between the waveguide and the plurality of nozzles;
   a plurality of second stubs secured to the second waveguide portion along a longitudinal length overlapping said first length, wherein one or more of the second stubs are disposed above and around a corresponding one of the nozzles and operative to control an amount of microwave taken by the corresponding nozzle.

2. The plasma generation device according to claim 1, wherein:
   the plasma generation nozzles are arranged along a first straight line extending in a direction where the microwave propagates; and
   the plurality of second stubs are arranged along a second straight line parallel to the first straight line and offset from the first straight line.

3. The plasma generation device according to claim 2, wherein, for a wavelength of the microwave, $\lambda G$:
   the plasma generation nozzles and the second stubs are each set in an array at a pitch of $\lambda G/4$;
   a distance by which the second stubs are shifted from the plasma generation nozzles in the direction where the microwave propagates is $\lambda G/8$; and
   the second straight line is offset by $\lambda G/16$ from the first straight line.

4. The plasma generation device according to claim 1, further comprising:
   a microwave reflection member disposed downstream of the plasma generation nozzles.

5. The plasma generation device according to claim 1, wherein the plasma generation nozzles and second stubs are arranged along a third straight line extending in a direction where the microwave propagates.

6. The plasma generation device according to claim 1, wherein the plasma generation nozzles are arranged randomly and the one or more second stubs corresponding to a plasma generation nozzle are located around thereof.

7. The plasma generation device according to claim 1, wherein the plasma generation nozzles are disposed along a plurality of straight lines extending parallel to a direction where the microwave propagates and each said second stub corresponding to one of the plasma generation nozzles is disposed around the corresponding plasma generation nozzle.

8. The plasma generation device according to claim 1, wherein a downstream end of the second waveguide portion is a reflection-free end.

9. The plasma generation device according to claim 1, wherein the protrusion length of each said second stub into the waveguide is adjustable.

10. The plasma generation device according to claim 1, further comprising:
    an adjustment mechanism for adjusting a protrusion length of each said second stub into the waveguide;
    a photo-sensor provided to detect a lighting state of plasma for each said plasma generation nozzle; and
    a control portion for controlling the protrusion length of each one of the said second stubs in response to a detection result of the photo-sensor.

11. The plasma generation device according to claim 1, further comprising:
    a microwave generation portion coupled to the waveguide and operative to generate the microwave.

12. The plasma generation device according to claim 1, wherein one or more of said second stubs is disposed at a rear position of corresponding one of the plasma generation nozzles in the direction where the microwave propagates.

13. The plasma generation device according to claim 1, wherein one or more of said second stubs is disposed at a front position of corresponding one of the plasma generation nozzles in the direction where the microwave propagates.

14. A plasma generation device, comprising:
    a microwave generation portion which generates a microwave;
    a waveguide for propagating the microwave, the waveguide including a first waveguide portion and a second waveguide portion downstream from the first waveguide portion;
    a plurality of plasma generation nozzles which are attached to the second waveguide portion so as to be apart from each other in the direction where the microwave is propagated, receive the microwave, and generate and emit a plasmatic gas based on the energy of this microwave;
    a plurality of first stubs secured to the first waveguide portion and for making an impedance match between the waveguide and the plasma generation nozzles; and
    a plurality of second stubs which correspond to a part or the whole part of the plasma generation nozzles and are each disposed in the second waveguide portion so as to lie in a rear position with respect to corresponding plasma generation nozzle, and disposed a predetermined distance apart from each other in the direction where the microwave is propagated.

15. A work processing apparatus for processing a work, comprising:
    the plasma generation device according to claim 14; and
    a mechanism for moving a work relative to the plasma generation nozzles so that the work is irradiated with plasma generated by the plasma generation nozzles.

16. A plasma generation device, comprising:
    a waveguide extending in a longitudinal direction for propagating a microwave therethrough;
    a plurality of first stubs secured to a first portion of the waveguide;
    a plurality of plasma generation nozzles arranged along a first straight line extending in a direction where the microwave propagates, secured to a second portion of the waveguide downstream from the first portion, and operative to receive processing gas and excite the processing gas into plasma using the microwave; and
    a plurality of second stubs arranged along a second straight line parallel to the first straight line and secured to the second portion of the waveguide, wherein for each one nozzle of said plurality of nozzles there is a corresponding at least one second stub disposed nearer to said one nozzle than a nearest adjacent other nozzle of said plurality of nozzles;
    wherein said plurality of first stubs are configured to provide impedance matching along the waveguide to minimize microwave reflection;

wherein the microwave becomes progressively feebler along the waveguide second portion as microwave is taken up by the plurality of nozzles;

wherein said plurality of second stubs are configured to regulate mutual interference among adjacent nozzles along the first line in a manner that allows downstream nozzles to take up a same amount of microwave as upstream nozzles for all nozzles among the plurality of nozzles.

* * * * *